(12) United States Patent
Okazaki et al.

(10) Patent No.: US 9,614,095 B2
(45) Date of Patent: Apr. 4, 2017

(54) SEMICONDUCTOR DEVICE

(75) Inventors: Kenichi Okazaki, Tochigi (JP);
Masahiro Watanabe, Tochigi (JP);
Mitsuo Mashiyama, Tochigi (JP)

(73) Assignee: SEMICONDUCTOR ENERGY LABORATORY CO., LTD., Kanagawa-ken (JP)

( * ) Notice: Subject to any disclaimer, the term of this patent is extended or adjusted under 35 U.S.C. 154(b) by 247 days.

(21) Appl. No.: 13/568,451

(22) Filed: Aug. 7, 2012

(65) Prior Publication Data
US 2013/0043465 A1 Feb. 21, 2013

(30) Foreign Application Priority Data

Aug. 18, 2011 (JP) .................................. 2011-178799

(51) Int. Cl.
*H01L 29/78* (2006.01)
*H01L 29/786* (2006.01)

(52) U.S. Cl.
CPC ................. *H01L 29/7869* (2013.01)

(58) Field of Classification Search
CPC ................................................. H01L 29/78693
USPC ........................................................ 257/43
See application file for complete search history.

(56) References Cited

U.S. PATENT DOCUMENTS

| | | |
|---|---|---|
| 5,731,856 A | 3/1998 | Kim et al. |
| 5,744,864 A | 4/1998 | Cillessen et al. |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |

(Continued)

FOREIGN PATENT DOCUMENTS

| | | |
|---|---|---|
| EP | 1 737 044 A1 | 12/2006 |
| EP | 2 226 847 A2 | 9/2010 |

(Continued)

OTHER PUBLICATIONS

Fortunato.E et al., "Wide-Bandgap High-Mobility ZnO Thin-Film Transistors Produced At Room Temperature,", Appl. Phys. Lett. (Applied Physics Letters ) , Sep. 27, 2004, vol. 85, No. 13, pp. 2541-2543.

(Continued)

*Primary Examiner* — Peniel M Gumedzoe
*Assistant Examiner* — Christopher Johnson
(74) *Attorney, Agent, or Firm* — Nixon Peabody LLP; Jeffrey L. Costellia

(57) ABSTRACT

An oxide semiconductor transistor comprising an oxide semiconductor layer with high conductivity is provided. A semiconductor device including an oxide semiconductor layer comprising an oxide containing indium, gallium, and zinc (IGZO) and a particle of indium oxide; a gate electrode overlapping with a channel formation region in the oxide semiconductor layer with a gate insulating film interposed therebetween; and a source electrode and a drain electrode overlapping with a source region and a drain region in the oxide semiconductor layer. The semiconductor device may be a top-gate oxide semiconductor transistor or a bottom-gate oxide semiconductor transistor. The oxide semiconductor layer may be formed over or below the source electrode and the drain electrode.

15 Claims, 12 Drawing Sheets

(56) References Cited

U.S. PATENT DOCUMENTS

| | | |
|---|---|---|
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,851,792 B2 | 12/2010 | Aiba et al. |
| 8,304,773 B2 | 11/2012 | Shimada |
| 8,329,506 B2 | 12/2012 | Akimoto et al. |
| 8,330,156 B2 | 12/2012 | Yamazaki et al. |
| 8,643,011 B2 | 2/2014 | Akimoto et al. |
| 9,252,288 B2 | 2/2016 | Akimoto et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065839 A1* | 3/2010 | Yamazaki et al. ............... 257/43 |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0123130 A1* | 5/2010 | Akimoto et al. ............... 257/43 |
| 2010/0163860 A1* | 7/2010 | Yano et al. ............... 257/43 |
| 2010/0163867 A1 | 7/2010 | Yamazaki et al. |
| 2016/0111282 A1 | 4/2016 | Akimoto et al. |

FOREIGN PATENT DOCUMENTS

| | | |
|---|---|---|
| JP | 60-198861 | 10/1985 |
| JP | 63-210022 | 8/1988 |
| JP | 63-210023 | 8/1988 |
| JP | 63-210024 | 8/1988 |
| JP | 63-215519 | 9/1988 |
| JP | 63-239117 | 10/1988 |
| JP | 63-265818 | 11/1988 |
| JP | 05-251705 | 9/1993 |
| JP | 08-264794 | 10/1996 |
| JP | 11-505377 | 5/1999 |
| JP | 2000-044236 | 2/2000 |
| JP | 2000-150900 | 5/2000 |
| JP | 2002-076356 | 3/2002 |
| JP | 2002-289859 | 10/2002 |
| JP | 2003-086000 | 3/2003 |
| JP | 2003-086808 | 3/2003 |
| JP | 2004-103957 | 4/2004 |
| JP | 2004-273614 | 9/2004 |
| JP | 2004-273732 | 9/2004 |
| JP | 2007-096055 | 4/2007 |
| JP | 2007-123861 | 5/2007 |
| JP | 2007-158307 A | 6/2007 |
| JP | 2009-141001 A | 6/2009 |
| JP | 2010-153802 A | 7/2010 |
| JP | 2010-171406 A | 8/2010 |
| JP | 2010-199307 A | 9/2010 |
| KR | 2010-0097002 A | 9/2010 |
| WO | WO-2004/114391 A1 | 12/2004 |
| WO | WO-2007/055256 | 5/2007 |
| WO | WO-2009/072533 | 6/2009 |

OTHER PUBLICATIONS

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using Cg-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. ( Applied Physics Letters ) , Jun. 26, 2007, vol. 90, No. 26, pp. 262106-1-262106-3.

(56) References Cited

OTHER PUBLICATIONS

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.
Hayashi.R et al., "42.1: Invited Paper: Improved Amorphous In—Ga—Zn—O TFTs,", SID Digest '08 : SID International Symposium Digest of Technical Papers, May 20, 2008, vol. 39, pp. 621-624.
Prins.M et al., "A Ferroelectric Transparent Thin-Film Transistor,", Appl. Phys. Lett. (Applied Physics Letters), Jun. 17, 1996, vol. 68, No. 25, pp. 3650-3652.
Nakamura.M et al., "The phase relations in the In2O3—Ga2ZnO4—ZnO system at 1350° C.,", Journal of Solid State Chemistry, Aug. 1, 1991, vol. 93, No. 2, pp. 298-315.
Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System,", Journal of Solid State Chemistry, Apr. 1, 1995, vol. 116, No. 1, pp. 170-178.
Nomura.K et al., "Thin-Film Transistor Fabricated in Single-Crystalline Transparent Oxide Semiconductor,", Science, May 23, 2003, vol. 300, No. 5623, pp. 1269-1272.
Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.
Asakuma.N et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.
Osada.T et al., "15.2: Development of Driver-Integrated Panel using Amorphous In—Ga—Zn-Oxide TFT,", SID Digest '09 : SID International Symposium Digest of Technical Papers, May 31, 2009, pp. 184-187.
Nomura.K et al., "Carrier transport in transparent oxide semiconductor with intrinsic structural randomness probed using single-crystalline InGaO3(ZnO)5 films,", Appl. Phys. Lett. (Applied Physics Letters), Sep. 13, 2004, vol. 85, No. 11, pp. 1993-1995.
Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.
Son.K et al., "42.4L: Late-News Paper: 4 Inch QVGA AMOLED Driven by the Threshold Voltage Controlled Amorphous GIZO (Ga2O3—In2O3—ZnO) TFT,", SID Digest '08 : SID International Symposium Digest of Technical Papers, May 20, 2008, vol. 39, pp. 633-636.
Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.
Nowatari.H et al., "60.2: Intermediate Connector With Suppressed Voltage Loss for White TANDEM OLEDs,", SID Digest '09 : SID International Symposium Digest of Technical Papers, May 31, 2009, vol. 40, pp. 899-902.
Kanno.H et al., "White Stacked Electrophosphorecent Organic Light-Emitting Devices Employing MOO3 as a Charge-Generation Layer,", Adv. Mater. (Advanced Materials), 2006, vol. 18, No. 3, pp. 339-342.
Tsuda.K et al., "Ultra Low Power Consumption Technologies for Mobile TFT-LCDs,", IDW '02 : Proceedings of the 9th International Display Workshops, Dec. 4, 2002, pp. 295-298.
Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.
Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array,", SID Digest '08 : SID International Symposium Digest of Technical Papers, May 20, 2008, vol. 39, No. 1, pp. 1-4.
Park.J et al., "High performance amorphous oxide thin film transistors with self-aligned top-gate structure,", IEDM 09: Technical Digest of International Electron Devices Meeting, Dec. 7, 2009, pp. 191-194.
Kurokawa.Y et al., "UHF RFCPUS on Flexible and Glass Substrates for Secure RFID Systems,", Journal of Solid-State Circuits, 2008, vol. 43, No. 1, pp. 292-299.
Ohara.H et al., "Amorphous In—Ga—Zn-Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.
Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.
Cho.D et al., "21.2:Al and Sn-Doped Zinc Indium Oxide Thin Film Transistors for AMOLED Back-Plane,", SID Digest '09 : SID International Symposium Digest of Technical Papers, May 31, 2009, pp. 280-283.
Lee.M et al., "15.4:Excellent Performance of Indium-Oxide-Based Thin-Film Transistors by DC Sputtering,", SID Digest '09 : SID International Symposium Digest of Technical Papers, May 31, 2009, pp. 191-193.
Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.
Sakata.J et al., "Development of 4.0-In. AMOLED Display With Driver Circuit Using Amorphous In—Ga—Zn-Oxide TFTs,", IDW '09 : Proceedings of the 16th International Display Workshops, 2009, pp. 689-692.
Park.J et al., "Amorphous Indium-Gallium-Zinc Oxide TFTs and Their Application for Large Size AMOLED,", AM-FPD '08 Digest of Technical Papers, Jul. 2, 2008, pp. 275-278.
Park.S et al., "Challenge to Future Displays: Transparent AM-OLED Driven by Peald Grown ZnO TFT,", IMID '07 Digest, 2007, pp. 1249-1252.
Godo.H et al., "Temperature Dependence of Characteristics and Electronic Structure for Amorphous In—Ga—Zn-Oxide TFT,", AM-FPD '09 Digest of Technical Papers, Jul. 1, 2009, pp. 41-44.
Osada.T et al., "Development of Driver-Integrated Panel Using Amorphous In—Ga—Zn-Oxide TFT,", AM-FPD '09 Digest of Technical Papers, Jul. 1, 2009, pp. 33-36.
Hirao.T et al., "Novel Top-Gate Zinc Oxide Thin-Film Transistors (ZnO TFTs) for AMLCDs,", Journal of the SID, 2007, vol. 15, No. 1, pp. 17-22.
Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.
Godo.H et al., "P-9:Numerical Analysis on Temperature Dependence of Characteristics of Amorphous In—Ga—Zn-Oxide TFT,", SID Digest '09 : SID International Symposium Digest of Technical Papers, May 31, 2009, pp. 1110-1112.
Ohara.H et al., "21.3:4.0 In. QVGA AMOLED Display Using In—Ga—Zn-Oxide TFTs With a Novel Passivation Layer,", SID Digest '09 : SID International Symposium Digest of Technical Papers, May 31, 2009, pp. 284-287.
Miyasaka.M, "SUFTLA Flexible Microelectronics on Their Way to Business,", SID Digest '07 : SID International Symposium Digest of Technical Papers, 2007, vol. 38, pp. 1673-1676.
Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.
Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

(56) References Cited

OTHER PUBLICATIONS

Asaoka.Y et al., "29.1:Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N et al., "Spinel,$YBFE_2O_4$, and $YB_2FE_3O_7$ Types of Structures for Compounds in the $In_2O_3$ and $Sc_2O_3$—$A_2O_3$—BO Systems [A; Fe, Ga, or Al; B: Mg, Mn, Fe, Ni, Cu,or Zn] At Temperatures Over 1000° C.,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent $InGaZnO_4$,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics), 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water,", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters), 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide $InGaO_3(ZnO)m$ (m <4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on $SrTiO_3$ With Sputtered $Al_2O_3$ Gate Insulator,", Appl. Phys. Lett. (Applied Physics Letters), Sep. 1, 2003, vol. 83, No. 9, pp. 1755-1757.

\* cited by examiner

L/W : 3 μm/3 μm
CONDITIONS: 450°C、1h、$N_2$ → 450°C、1h、$N_2+O_2$

SEMICONDUCTOR DEVICE

BACKGROUND OF THE INVENTION

1. Field of the Invention

One embodiment of the disclosed invention relates to a semiconductor device.

2. Description of the Related Art

In recent years, a technique in which transistors are manufactured using an oxide semiconductor and applied to electronic devices or optical devices has attracted attention. For example, Patent Document 1 and Patent Document 2 disclose a technique in which a transistor is formed using an oxide containing indium (In), gallium (Ga), and zinc (Zn) (hereinafter called "IGZO") as an oxide semiconductor to manufacture a display device using the transistor.

REFERENCE

Patent Document

[Patent Document 1] Japanese Published Patent Application No. 2007-123861
[Patent Document 2] Japanese Published Patent Application No. 2007-096055

SUMMARY OF THE INVENTION

IGZO has low conductivity. An oxide semiconductor transistor in which IGZO is used for an active layer might have a low on-state current, for example.

In view of the above, an object of one embodiment of the disclosed invention is to provide an oxide semiconductor transistor including an oxide semiconductor layer with high conductivity.

One embodiment of the disclosed invention relates to a semiconductor device including an oxide semiconductor layer comprising an oxide containing indium, gallium, and zinc (IGZO) and a particle of indium oxide; a gate electrode overlapping with a channel formation region in the oxide semiconductor layer with a gate insulating film interposed therebetween; and a source electrode and a drain electrode overlapping with a source region and a drain region in the oxide semiconductor layer.

According to one embodiment of the disclosed invention, an oxide semiconductor layer comprises IGZO in which a crystal of indium oxide ($In_2O_3$) formed by bonding indium and oxygen contained in IGZO together exists as a particle.

Indium oxide whose energy gap is 2.8 eV is a semiconductor which is close to an insulator in characteristics. When indium and oxygen included in IGZO form a particle of indium oxide which is close to an insulator in characteristics, electric charge in IGZO is polarized. That is, in IGZO, the particle of indium oxide has characteristics close to those of an insulator, while a portion from which oxygen and indium are extracted to form the particle of indium oxide has higher conductivity than the other portions. In addition, particles of indium oxide are dispersed in the oxide semiconductor layer; for this reason, the movement of carriers is not interrupted. Thus, the oxide semiconductor layer comprising IGZO in which the particle of indium oxide exists has high conductivity.

By using the oxide semiconductor layer with high conductivity as an oxide semiconductor layer of an oxide semiconductor transistor, the carrier mobility increases and the on-state current of the oxide semiconductor transistor increases.

One embodiment of the disclosed invention relates to a semiconductor device including: a gate electrode; a gate insulating film covering the gate electrode; an oxide semiconductor layer comprising an oxide containing indium, gallium, and zinc and a particle of indium oxide, and overlapping with the gate electrode with the gate insulating film interposed therebetween; and a source electrode and a drain electrode over a source region and a drain region in the oxide semiconductor layer.

One embodiment of the disclosed invention relates to a semiconductor device including: a gate electrode; a gate insulating film covering the gate electrode; a source electrode and a drain electrode over the gate insulating film; and an oxide semiconductor layer comprising an oxide containing indium, gallium, and zinc and a particle of indium oxide. The oxide semiconductor layer is located over the gate electrode with the gate insulating film interposed therebetween, and is located over the source electrode and the drain electrode.

One embodiment of the disclosed invention relates to a semiconductor device including: an oxide semiconductor layer comprising an oxide containing indium, gallium, and zinc and a particle of indium oxide; a source electrode and a drain electrode over a source region and a drain region in the oxide semiconductor layer; a gate insulating film covering the oxide semiconductor layer, the source electrode and the drain electrode; and a gate electrode over a channel formation region in the oxide semiconductor layer with the gate insulating film interposed therebetween.

One embodiment of the disclosed invention relates to a semiconductor device including: a source electrode and a drain electrode; an oxide semiconductor layer over the source electrode and the drain electrode, which comprises an oxide containing indium, gallium, and zinc and a particle of indium oxide, and includes a source region and a drain region overlapping with the source electrode and the drain electrode; a gate insulating film covering the oxide semiconductor layer; and a gate electrode over a channel formation region in the oxide semiconductor layer with the gate insulating film interposed therebetween.

According to one embodiment of the disclosed invention, an oxide semiconductor transistor including an oxide semiconductor layer with high conductivity can be provided.

DETAILED DESCRIPTION OF THE INVENTION

Figure 1A:
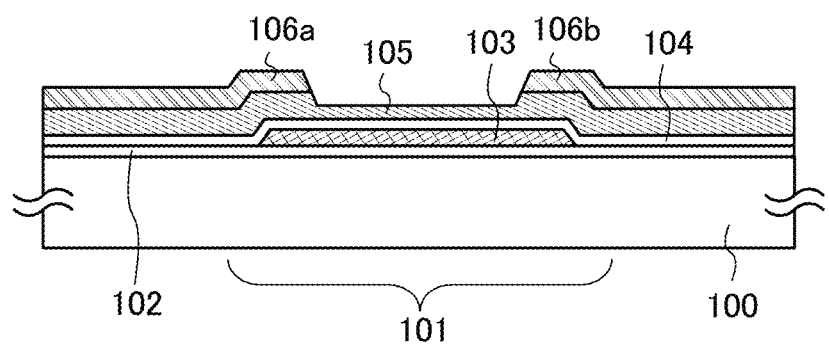
FIGS. 1A and 1B are cross-sectional views of semiconductor devices.

Embodiment of the invention disclosed in this specification will be hereinafter described with reference to the accompanying drawings. Note that the invention disclosed in this specification can be carried out in a variety of different modes, and it is easily understood by those skilled in the art that the modes and details of the invention disclosed in this specification can be changed in various ways without departing from the spirit and scope thereof. Therefore, the present invention is not construed as being limited to description of the embodiment. Note that, in the drawings hereinafter shown, the same portions or portions having similar functions are denoted by the same reference numerals, and repeated description thereof will be omitted.

Note that in the invention disclosed in this specification, a semiconductor device refers to an element or a device which functions by utilizing a semiconductor and includes, in its category, an electric device including an electronic circuit, a display device, a light-emitting device, and the like and an electronic appliance on which the electric device is mounted.

Note that the position, size, range, or the like of each structure shown in the drawings and the like is not accurately represented in some cases for easy understanding. Therefore, the disclosed invention is not necessarily limited to the position, size, range, or the like as disclosed in the drawings and the like.

In this specification and the like, ordinal numbers such as "first", "second", and "third" are used in order to avoid confusion among components, and the terms do not mean limitation of the number of components.

FIGS. 1A and 1B and FIGS. 2A and 2B illustrate structures of oxide semiconductor transistors according to this embodiment.

An oxide semiconductor transistor 101 illustrated in FIG. 1A includes a base insulating film 102 over a substrate 100; a gate electrode 103 over the base insulating film 102; a gate insulating film 104 covering the base insulating film 102 and the gate electrode 103; an oxide semiconductor layer 105 overlapping with the gate electrode 103 with the gate insulating film 104 interposed therebetween and functioning as an active layer; and an electrode 106a and an electrode 106b over a source region and a drain region in the oxide semiconductor layer 105 and functioning as a source electrode and a drain electrode.

The oxide semiconductor transistor 101 illustrated in FIG. 1A is a bottom-gate transistor in which the gate electrode 103 is formed below the oxide semiconductor layer 105, and is also a top-contact transistor in which the electrode 106a and the electrode 106b functioning as the source electrode and the drain electrode are formed over the oxide semiconductor layer 105.

In the oxide semiconductor transistor 101 illustrated in FIG. 1A, a region of the oxide semiconductor layer 105, which is over the gate electrode 103, that is, a channel formation region, has a smaller thickness than the other regions thereof due to the influence of etching and the like. The transistor whose channel formation region is thin is referred to as a channel-etch transistor. The oxide semiconductor transistor 101 illustrated in FIG. 1A may be not only the channel-etch transistor, but also a channel-protective transistor which has a protective insulating film over a channel formation region.

Figure 1B:
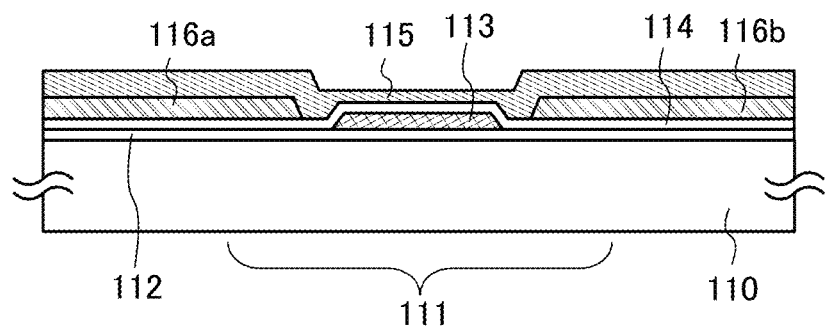

An oxide semiconductor transistor 111 illustrated in FIG. 1B includes a base insulating film 112 over a substrate 110; a gate electrode 113 over the base insulating film 112; a gate insulating film 114 covering the base insulating film 112 and the gate electrode 113; an electrode 116a and an electrode 116b over the gate insulating film 114 and functioning as a source electrode and a drain electrode; and an oxide semiconductor layer 115. The oxide semiconductor layer 115 functioning as an active layer is located over the gate electrode 113 with the gate insulating film 114 interposed therebetween, and is located over the electrode 116a and the electrode 116b functioning as the source electrode and the drain electrode.

In FIG. 1B, the electrode 116a and the electrode 116b functioning as a source electrode and a drain electrode do not overlap with the gate electrode 113. If needed, portions of the electrode 116a and the electrode 116b may overlap with the gate electrode 113 with the gate insulating film 114 interposed therebetween.

The oxide semiconductor transistor 111 illustrated in FIG. 1B is a bottom-gate transistor in which the gate electrode 113 is formed below the oxide semiconductor layer 115, and is also a bottom-contact transistor in which the electrode 116a and the electrode 116b functioning as the source electrode and the drain electrode are formed below portions of the oxide semiconductor layer 115.

Figure 2A:
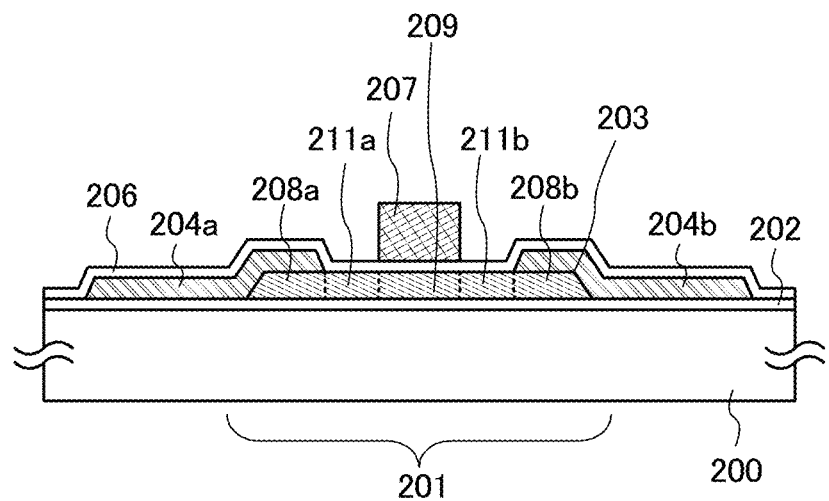
FIGS. 2A and 2B are cross-sectional views of semiconductor devices.

An oxide semiconductor transistor 201 illustrated in FIG. 2A includes a base insulating film 202 over a substrate 200; an oxide semiconductor layer 203 over the base insulating film 202 and functioning as an active layer; an electrode 204a and an electrode 204b over the oxide semiconductor layer 203 and functioning as a source electrode and a drain electrode; a gate insulating film 206 over the oxide semiconductor layer 203, the electrode 204a, and the electrode 204b; and a gate electrode 207 overlapping with a channel formation region 209 in the oxide semiconductor layer 203 with the gate insulating film 206 interposed therebetween.

The oxide semiconductor transistor 201 illustrated in FIG. 2A is a top-gate transistor in which the gate electrode 207 is formed over the oxide semiconductor layer 203, and is also a top-contact transistor in which the electrode 204a and the electrode 204b functioning as the source electrode and the drain electrode are formed over the oxide semiconductor layer 203.

A region 208a and a region 208b in the oxide semiconductor layer 203, which overlap with the electrode 204a and the electrode 204b, function as a source region and a drain region.

In addition, a region 211a is located between the channel formation region 209 and the region 208a, and a region 211b is located between the channel formation region 209 and the region 208b. The region 211a and the region 211b function as offset regions.

Figure 2B:
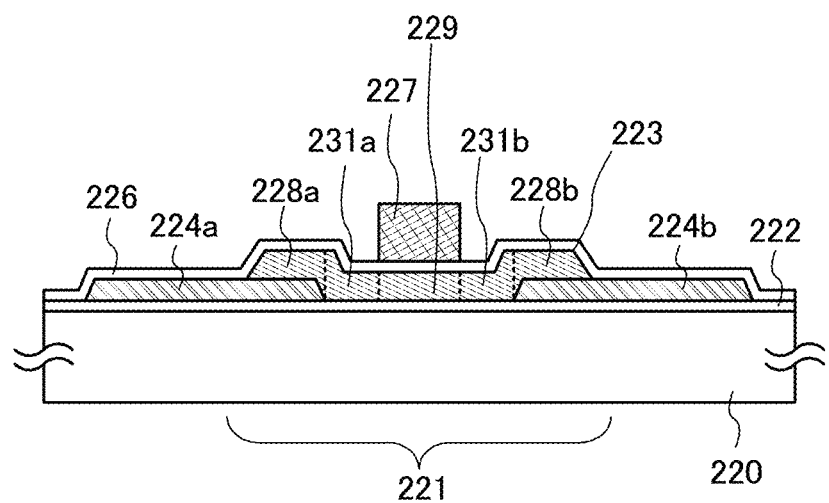

An oxide semiconductor transistor 221 illustrated in FIG. 2B includes a base insulating film 222 over a substrate 220; an electrode 224a and an electrode 224b over the base insulating film 222 and functioning as a source electrode and a drain electrode; an oxide semiconductor layer 223 over the electrode 224a and the electrode 224b, which includes a source region and a drain region overlapping with the electrode 224a and the electrode 224b, and which functions as an active layer; a gate insulating film 226 over the oxide semiconductor layer 223, the electrode 224a and the electrode 224b; and a gate electrode 227 overlapping with a channel formation region 229 in the oxide semiconductor layer 223 with the gate insulating film 226 interposed therebetween.

In FIG. 2B, the electrode 224a and the electrode 224b functioning as a source electrode and a drain electrode do not overlap with the gate electrode 227. If needed, portions of the electrode 224a and the electrode 224b may overlap with the gate electrode 227 with the oxide semiconductor layer 223 and the gate insulating film 226 interposed therebetween.

The oxide semiconductor transistor 221 illustrated in FIG. 2B is a top-gate transistor in which the gate electrode 227 is formed over the oxide semiconductor layer 223, and is also a bottom-contact transistor in which the electrode 224a and the electrode 224b functioning as the source electrode and the drain electrode are formed below the oxide semiconductor layer 223.

A region 228a and a region 228b in the oxide semiconductor layer 223, which overlap with the electrode 224a and the electrode 224b, function as a source region and a drain region.

In addition, a region 231a is located between the channel formation region 229 and the region 228a, and a region 231b is located between the channel formation region 229 and the region 228b. The region 231a and the region 231b function as offset regions.

The oxide semiconductor layer 105 in the oxide semiconductor transistor 101 illustrated in FIG. 1A, the oxide semiconductor layer 115 in the oxide semiconductor transistor 111 illustrated in FIG. 1B, the oxide semiconductor layer 203 in the oxide semiconductor transistor 201 illustrated in FIG. 2A, and the oxide semiconductor layer 223 in the oxide semiconductor transistor 221 illustrated in FIG. 2B are oxide semiconductor layers comprising IGZO and a particle of indium oxide.

As described above, the oxide semiconductor layer comprising IGZO and a particle of indium oxide is an oxide semiconductor layer comprising IGZO in which a crystal of indium oxide ($In_2O_3$) formed by bonding indium and oxygen included in IGZO together exists as a particle.

Indium oxide whose energy gap is 2.8 eV is a semiconductor which is close to an insulator in characteristics. When indium and oxygen contained in IGZO form a particle of indium oxide which is close to an insulator in characteristics, the distribution of an electric charge in IGZO becomes uneven. That is, in IGZO, the particle of indium oxide has characteristics close to those of an insulator, while a portion from which oxygen and indium are extracted to form the particle of indium oxide has higher conductivity than the other portions. In addition, the particle of indium oxide is dispersed in the oxide semiconductor layer; for this reason, the movement of carriers is not interrupted. Thus, the oxide semiconductor layer comprising IGZO in which the particle of indium oxide exists has high conductivity.

Therefore, an oxide semiconductor transistor including the oxide semiconductor layer comprising IGZO and a particle of indium oxide has high conductivity. The oxide semiconductor transistor with high conductivity has an advantage of having a high on-state current, for example.

Figure 3:
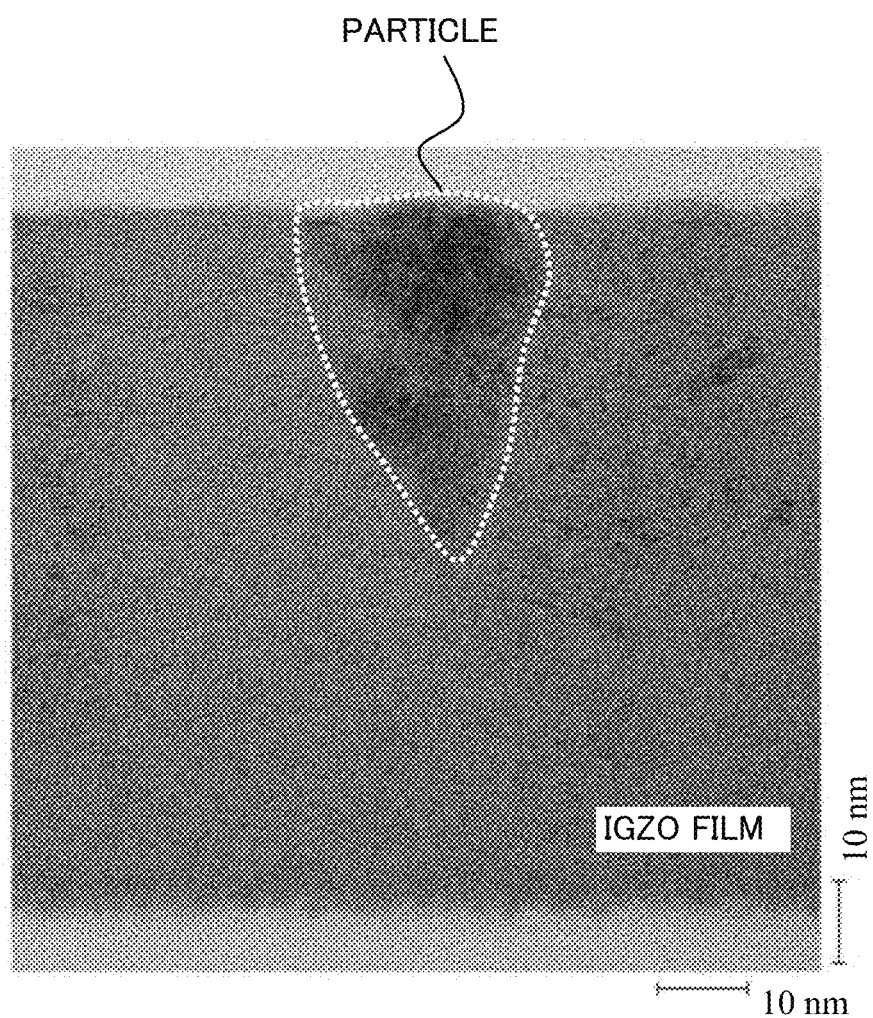
FIG. 3 is a TEM photograph of a cross section of an oxide semiconductor layer.

FIG. 3 is a TEM photograph of a cross section of an oxide semiconductor layer comprising IGZO and a particle used in this embodiment.

The oxide semiconductor layer comprising IGZO and a particle shown in FIG. 3 was formed at a substrate temperature of 250° C. by a sputtering method.

Upon analyzing the particle with a TEM-FFT (Transmission Electron Microscopy-Fast Fourier Transform), it turns out that the particle is indium oxide. The following shows that the particle is indium oxide.

The TEM-FFT can Fourier transform the pattern of an obtained lattice image and thereby analyze the spot position of the pattern, and can analyze an interplanar spacing in crystal and a crystal plane orientation.

Figure 4:
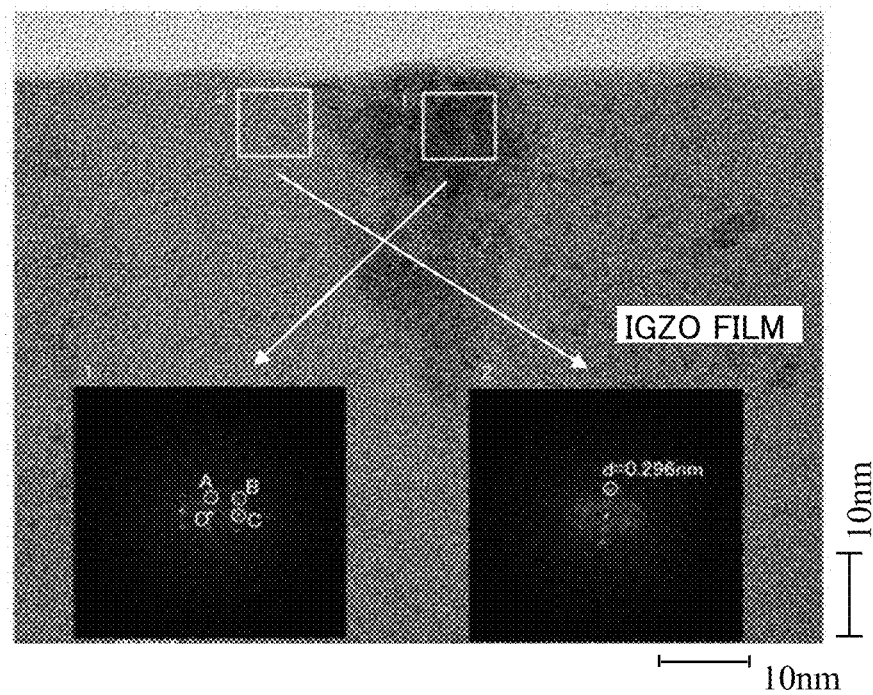
FIG. 4 shows a result of TEM-FFT analysis of an oxide semiconductor layer.

In this embodiment, a particle in an oxide semiconductor layer was analyzed with the TEM-FFT, and an interplanar spacing in crystal was obtained. The result was such that the d-value of the particle in the oxide semiconductor layer was A: 0.501 nm, B: 0.265 nm, and C: 0.302 nm (see FIG. 4). Since the d-value of indium oxide ($In_2O_3$) is A: 0.506 nm, B: 0.270 nm, and C: 0.320 nm, it is proved that a component of the particle is indium oxide ($In_2O_3$).

FIG. 5, FIG. 6, FIG. 7, FIG. 8, FIG. 9, FIG. 10, FIG. 11, and FIG. 12 each show a relation between a drain current (Id) and a gate voltage (Vg) of an oxide semiconductor transistor using an oxide semiconductor layer of this embodiment.

The oxide semiconductor transistors used in the measurement of FIG. 5, FIG. 6, FIG. 7, FIG. 8, FIG. 9, FIG. 10, FIG. 11, and FIG. 12 are the bottom-gate top-contact oxide semiconductor transistors 101 shown in FIG. 1A. In the oxide semiconductor transistor 101 used in the measurement of FIG. 5, the base insulating film 102 is a stacked-layer film in which a silicon oxynitride film with a film thickness of 150 nm is stacked over a silicon nitride film with a film thickness of 100 nm. The gate electrode 103 is a tungsten (W) film with a film thickness of 100 nm. The gate insulating film 104 is a silicon nitride film containing oxygen with a film thickness of 100 nm.

The oxide semiconductor layers 105 were formed to have a film thickness of 35 nm under the following conditions: the film formation pressure was 0.3 Pa, the film formation power was 9 kW (AC), the flow rate ratio of oxygen ($O_2$) to argon was set to 50%, and the substrate temperature was 150° C. After the film formation was performed under above conditions, the oxide semiconductor layers of FIG. 5, FIG. 7, FIG. 9, and FIG. 11 were baked at 350° C. for one hour in a nitrogen atmosphere, and then, were baked at 350° C. for one hour in an atmosphere containing nitrogen and oxygen, and the oxide semiconductor layers of FIG. 6, FIG. 8, FIG. 10, and FIG. 12 were baked at 450° C. for one hour in a nitrogen atmosphere, and then, were baked at 450° C. for one hour in an atmosphere containing nitrogen and oxygen. These oxide semiconductor layers were used as the oxide semiconductor layers 105 in the respective measurements.

An electrode 106a and an electrode 106b were formed using a stacked-layer film of a titanium film with a film thickness of 100 nm, an aluminum film with a film thickness of 400 nm, and a titanium film with a film thickness of 100 nm.

Figure 5:
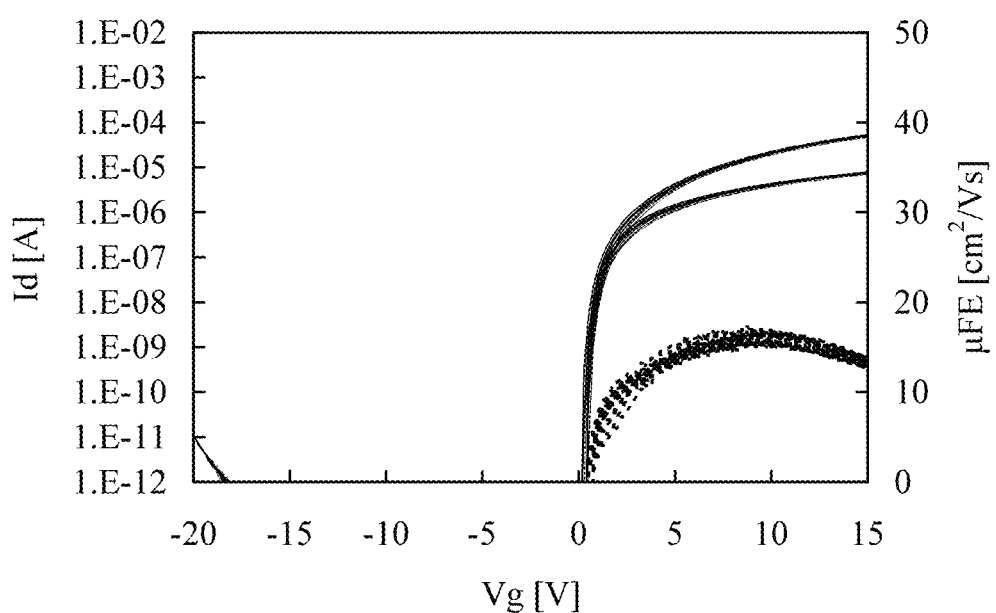
FIG. 5 shows a relation between a drain current (Id) and a gate voltage (Vg) of an oxide semiconductor transistor.
Figure 6:
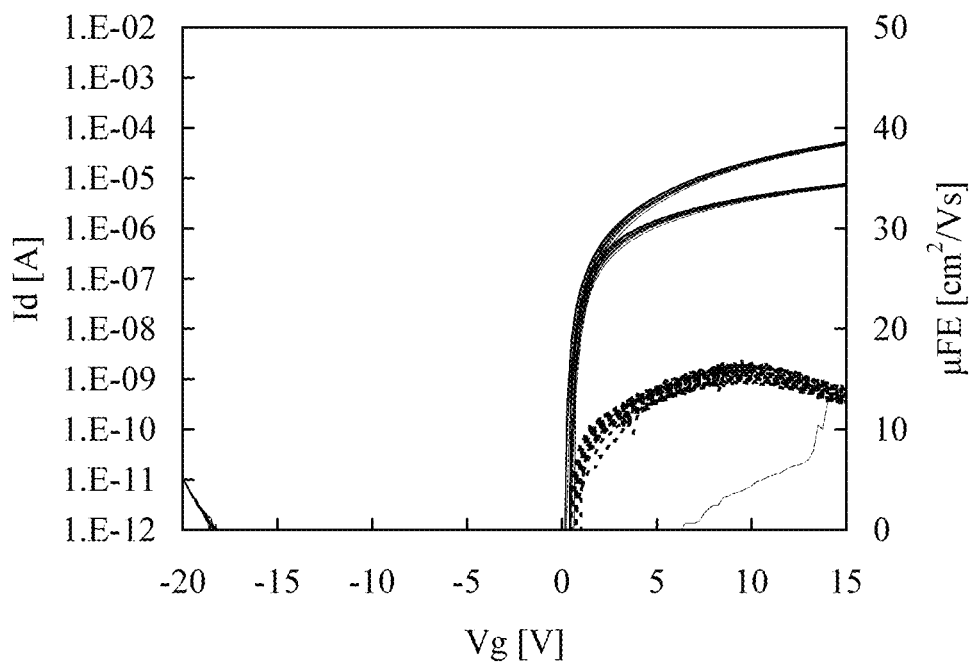
FIG. 6 shows a relation between a drain current (Id) and a gate voltage (Vg) of an oxide semiconductor transistor.
Figure 7:
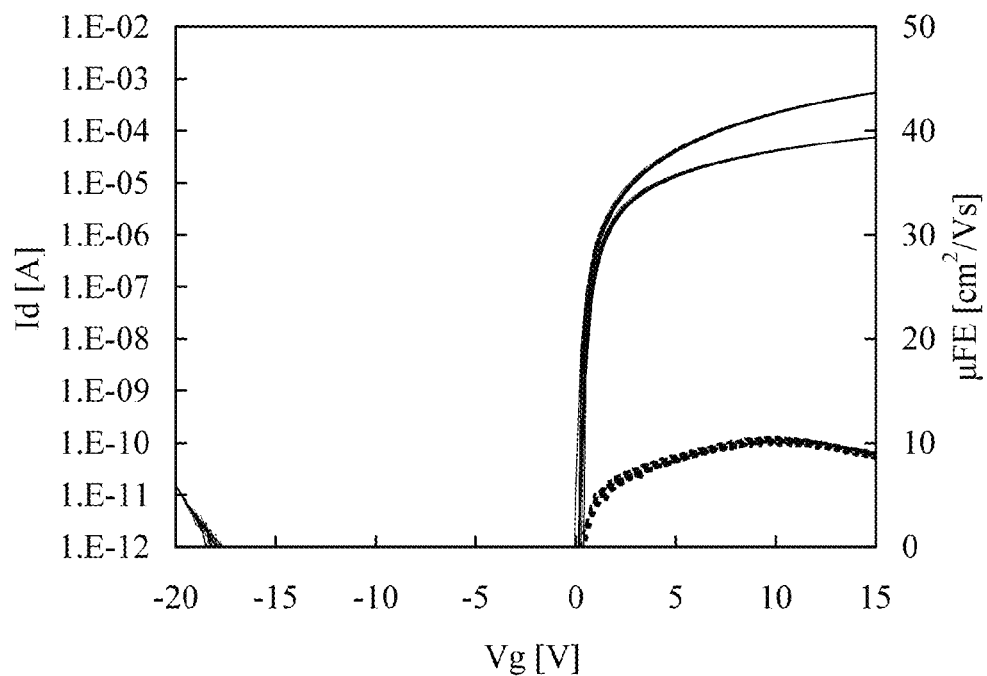
FIG. 7 shows a relation between a drain current (Id) and a gate voltage (Vg) of an oxide semiconductor transistor.
Figure 8:
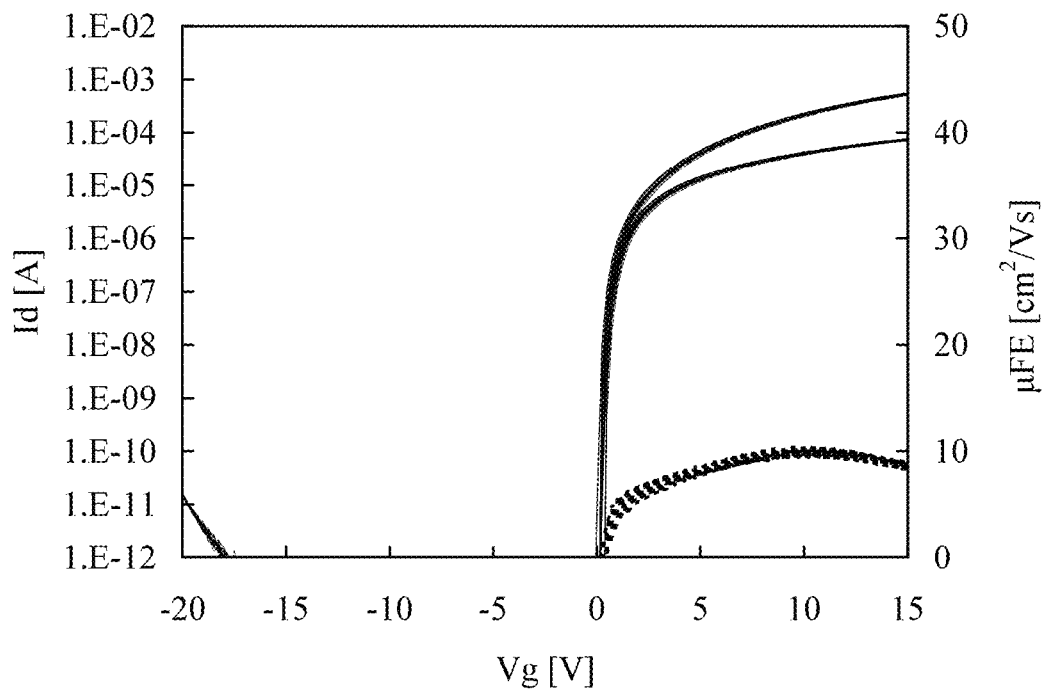
FIG. 8 shows a relation between a drain current (Id) and a gate voltage (Vg) of an oxide semiconductor transistor.
Figure 9:
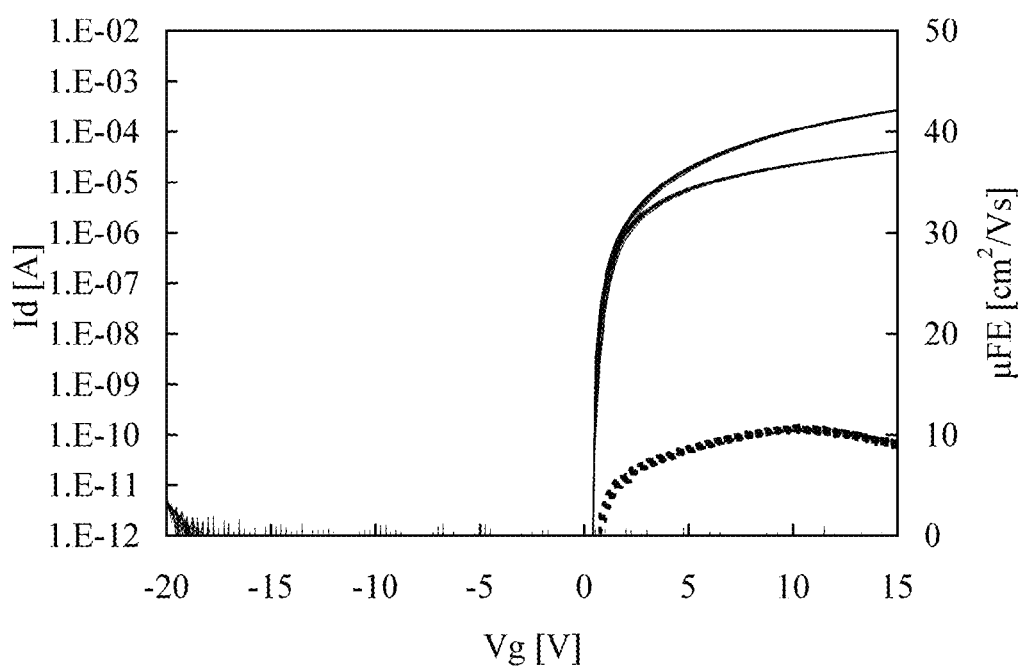
FIG. 9 shows a relation between a drain current (Id) and a gate voltage (Vg) of an oxide semiconductor transistor.
Figure 10:
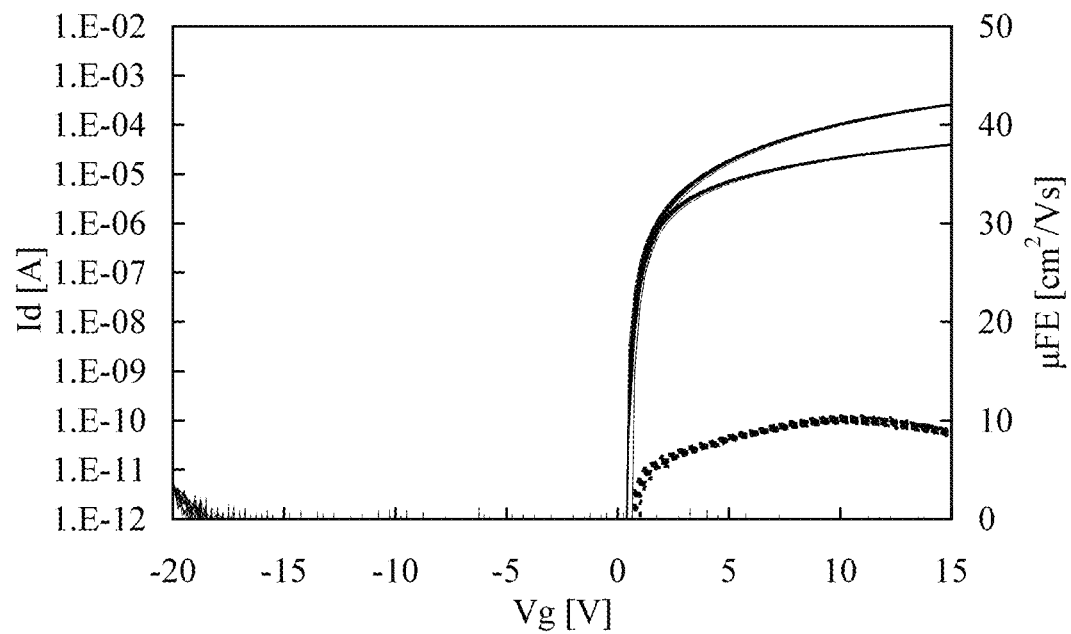
FIG. 10 shows a relation between a drain current (Id) and a gate voltage (Vg) of an oxide semiconductor transistor.
Figure 11:
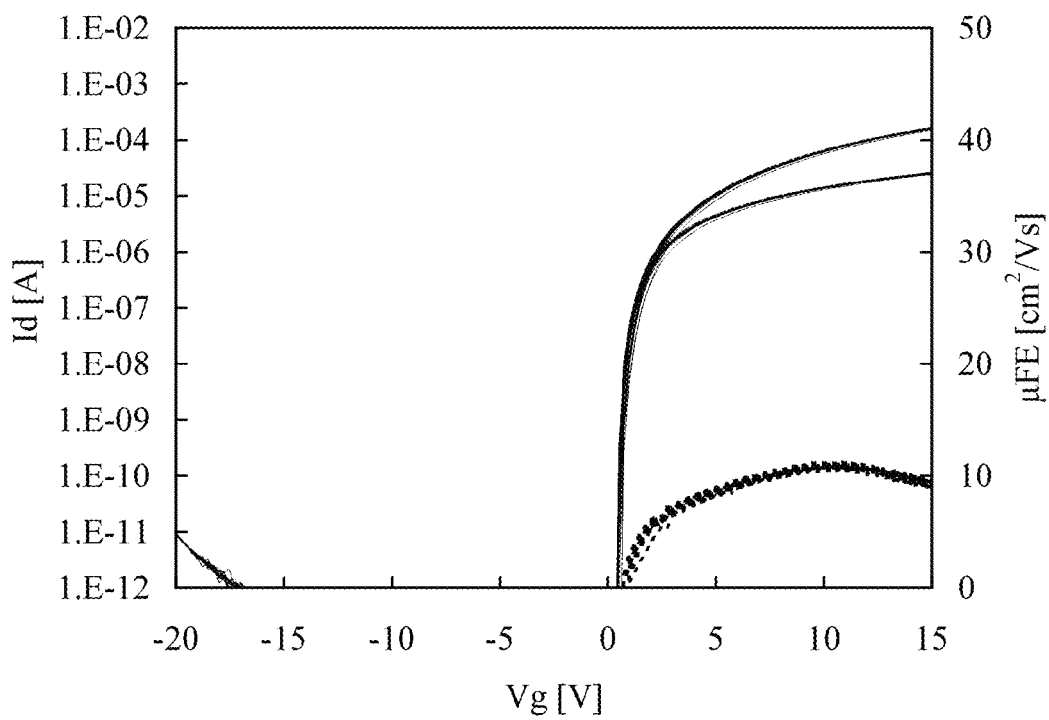
FIG. 11 shows a relation between a drain current (Id) and a gate voltage (Vg) of an oxide semiconductor transistor.
Figure 12:
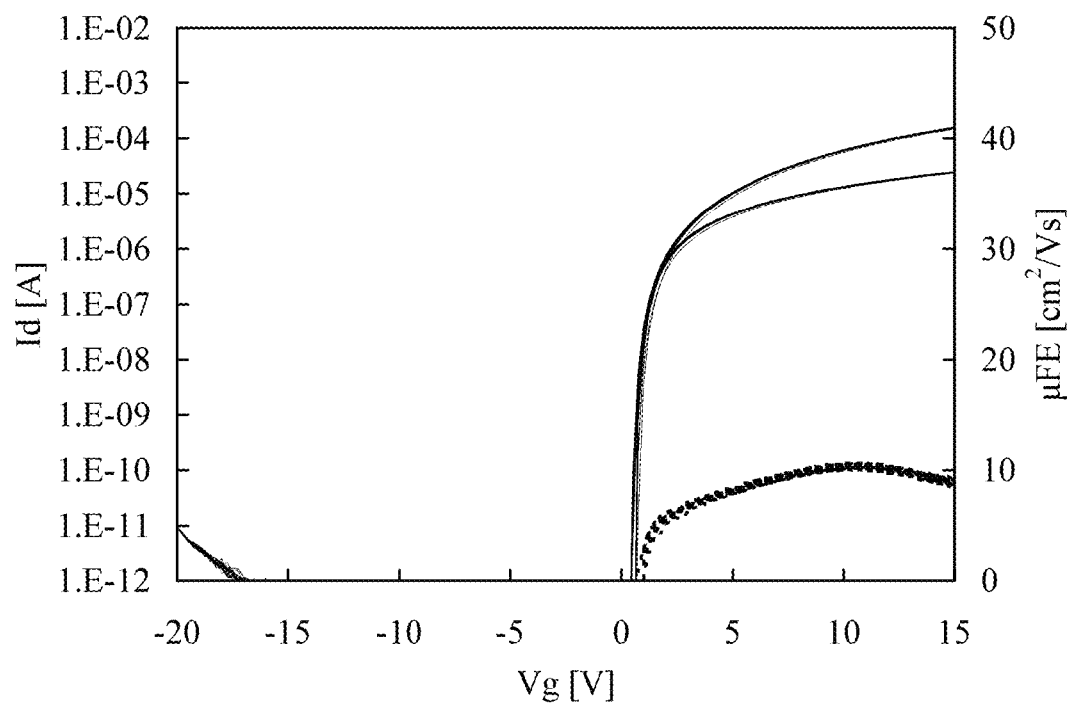
FIG. 12 shows a relation between a drain current (Id) and a gate voltage (Vg) of an oxide semiconductor transistor.

The oxide semiconductor transistors were made to have a channel length L of 3 μm and a channel width W of 3 μm in FIG. 5 and FIG. 6, to have a channel length L of 3 μm and a channel width W of 50 μm in FIG. 7 and FIG. 8, to have a channel length L of 6 μm and a channel width W of 50 μm in FIG. 9 and FIG. 10, and to have a channel length L of 10 μm and a channel width W of 50 μm in FIG. 11 and FIG. 12.

As an interlayer insulating film (not illustrated), a silicon oxide film of 400 nm in thickness and a photosensitive acrylic resin film of 1500 nm in thickness were formed to cover the oxide semiconductor transistor 101.

Finally, baking was performed at 250° C. for one hour in a nitrogen atmosphere.

As shown in FIG. 5, FIG. 6, FIG. 7, FIG. 8, FIG. 9, FIG. 10, FIG. 11, and FIG. 12, while there are some variations in the on-state current, the oxide semiconductor transistors of FIG. 5, FIG. 6, FIG. 7, FIG. 8, FIG. 9, FIG. 10, FIG. 11, and FIG. 12 each have a high on-state current. According to this embodiment, a favorable oxide semiconductor transistor whose on-state current is high can be obtained.

This application is based on Japanese Patent Application serial no. 2011-178799 filed with Japan Patent Office on Aug. 18, 2011, the entire contents of which are hereby incorporated by reference.

What is claimed is:

1. A semiconductor device comprising:
   a gate electrode;
   a gate insulating film covering the gate electrode;
   an oxide semiconductor layer comprising an oxide containing indium, gallium, and zinc and including a particle of indium oxide represented by $In_2O_3$, wherein the oxide semiconductor layer overlaps with the gate electrode with the gate insulating film interposed therebetween; and
   a source electrode and a drain electrode over a source region and a drain region in the oxide semiconductor layer,
   wherein the particle has a wedge shape.

2. The semiconductor device according to claim 1, wherein the oxide semiconductor layer is included in a channel-etch transistor.

3. The semiconductor device according to claim 1, further comprising a substrate and a base insulating film below the gate electrode.

4. The semiconductor device according to claim 1, wherein a tip of the wedge shape is in a direction apart from a top surface of the oxide semiconductor layer.

5. A semiconductor device comprising:
   a gate electrode over a substrate;
   an oxide semiconductor layer including a channel formation region, a source region, and a drain region, the channel formation region being adjacent to the gate electrode with a gate insulating film interposed therebetween; and
   a source electrode and a drain electrode being in contact with the source region and the drain region,
   wherein the oxide semiconductor layer comprises an oxide containing indium, gallium, and zinc and includes a particle of indium oxide represented by $In_2O_3$,
   wherein the oxide semiconductor layer includes:
     a first portion containing indium, gallium, zinc and oxygen; and
     a second portion,
   wherein a density of indium in the second portion is lower than a density of indium in the first portion,
   wherein a density of oxygen in the second portion is lower than a density of oxygen in the first portion,
   wherein the second portion has higher conductivity than other portions of the oxide semiconductor layer, and
   wherein the particle has a wedge shape.

6. The semiconductor device according to claim 5, further comprising a base insulating film on the substrate.

7. The semiconductor device according to claim 5, wherein the oxide semiconductor layer covers the gate electrode.

8. The semiconductor device according to claim 5, wherein the source electrode and the drain electrode are provided on the source region and the drain region, respectively.

9. The semiconductor device according to claim 5, wherein a tip of the wedge shape is in a direction apart from a top surface of the oxide semiconductor layer.

10. A semiconductor device comprising:
    a gate electrode over a substrate;
    an oxide semiconductor layer including a channel formation region, a source region, and a drain region, the channel formation region being adjacent to the gate electrode with a gate insulating film interposed therebetween; and
    a source electrode and a drain electrode being in electrical contact with the source region and the drain region,
    wherein the oxide semiconductor layer comprises an oxide containing indium, gallium, and zinc and includes a particle of indium oxide,
    wherein the oxide semiconductor layer includes:
      a first portion containing indium, gallium, zinc and oxygen; and
      a second portion,
    wherein a density of indium in the second portion is lower than a density of indium in the first portion,
    wherein a density of oxygen in the second portion is lower than a density of oxygen in the first portion,
    wherein the second portion has higher conductivity than other portions of the oxide semiconductor layer, and
    wherein the particle has a wedge shape.

11. The semiconductor device according to claim 10, further comprising a base insulating film on the substrate.

12. The semiconductor device according to claim 10, wherein the oxide semiconductor layer covers the gate electrode.

13. The semiconductor device according to claim 10, wherein the source electrode and the drain electrode are provided on the source region and the drain region, respectively.

14. The semiconductor device according to claim 10, wherein the indium oxide is represented by $In_2O_3$.

15. The semiconductor device according to claim 10, wherein a tip of the wedge shape is in a direction apart from a top surface of the oxide semiconductor layer.

* * * * *